Aug. 4, 1959 G. A. SILVEY ET AL 2,898,248

METHOD OF FABRICATING GERMANIUM BODIES

Filed May 15, 1957

INVENTORS
GENE A. SILVEY
VINCENT J. LYONS
BY Harry T. Berriman
AGENT 2,898,248

METHOD OF FABRICATING GERMANIUM BODIES

Gene A. Silvey, Elizaville, and Vincent J. Lyons, Wappingers Falls, N.Y., assignors to International Business Machines Corporation, New York, N.Y., a corporation of New York Application May 15, 1957, Serial No. 659,391

12 Claims. (Cl. 148—1.5)

This invention relates to a method for fabricating semiconductor bodies for signal translating devices and more particularly to a method for vapor deposition of a layer or coating of N conductivity type semiconductor material upon P conductivity type semiconductor material.

The invention is particularly applicable to transistors, rectifiers, and photocells of the well known class comprising two or more contiguous zones or portions of semiconductor material of opposite conductivity types, namely N or P types, each pair of contiguous zones forming what is commonly defined as a junction. The operating characteristics of these devices are determined to a large extent by the crystalline structure and the thickness of the contiguous zones.

The invention is specifically illustrated in the fabrication of PN junctions in germanium by deposition from the vapor phase of an N type germanium onto a P type germanium substrate. The deposition is epitaxial and the thickness of the deposited film or coating can be varied as desired. The vapor deposition is effected under controlled temperature and environment conditions to achieve a coating of uniform character. By combining this technique for depositing a layer of N type germanium with known techniques of P type germanium deposition, germanium bodies having sandwiched layers of N and P conductivity type germanium can be fabricated.

It is accordingly an object of the invention to provide an improved method for fabricating semiconductor bodies having contiguous zones of opposite conductivity type.

It is another object to provide an improved method for fabricating semiconductor bodies by depositing a film or coating of one conductivity type semiconductor material upon semiconductor material of an opposite conductivity type and wherein the crystalline structure and characteristics of the deposited film or coating may be accurately controlled.

It is still further object of the invention to provide an improved method of fabricating PN junctions in germanium by deposition from the vapor phase of N type germanium onto P type germanium, the deposition being epitaxial and the thickness of the deposited germanium being accurately controlled as desired.

Other objects of the invention will be pointed out in the following description and claims and illustrated in the accompanying drawings, which disclose, by way of example, the principle of the invention and the best mode, which has been contemplated, of applying that principle.

Figure 1:
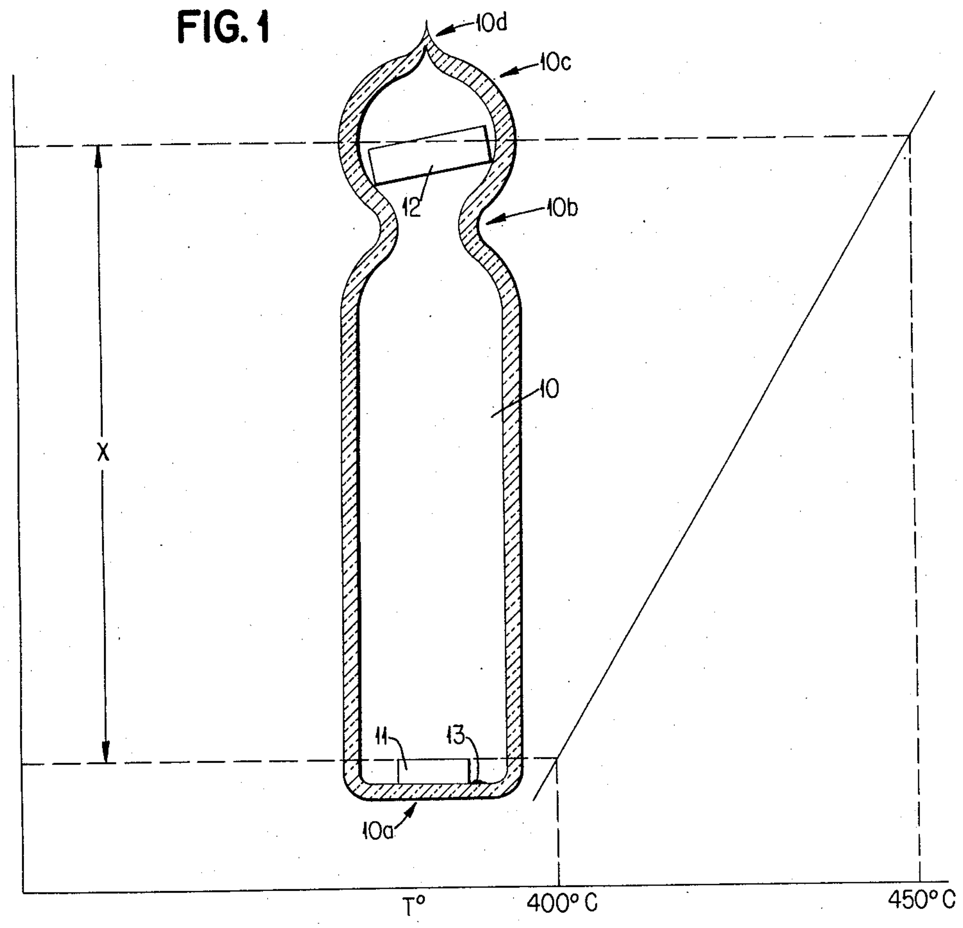
Fig. 1 is an elevational view, most of it in section, of apparatus utilized in preparing semiconductor bodies in accordance with the improved method, Fig. 1 including a graph illustrating the temperature distribution in the apparatus shown when the improved method is being carried out.

Referring now to Fig. 1, the deposition of N type germanium is accomplished in the apparatus illustrated by the following procedure. The illustrated apparatus comprises a quartz tube 10 having a substantially flat lower end 10*a*, a restricted neck portion 10*b*, and an enlarged head portion 10*c*, the latter being indicated as being sealed off at an upper end 10*d* thereof, but which is initially open. A P type germanium wafer 11 of desired resistivity, crystallographic orientation and size, which is to serve as the substrate, is inserted into the tube through the open end thereof and placed on the bottom surface 10*a*, as indicated. A small quantity of pure tellurium 13, about 1 milligram, is also placed in the quartz tube as indicated in Fig. 1. There is also inserted into the head section 10*c* of the tube another piece of germanium 12 preferably intrinsic or near intrinsic material, which is to be used as the source. The restricted neck portion 10*b* maintains the source germanium 12 in the head portion 10*c* of the tube as indicated.

Thereafter, the open end of the quartz tube is attached to a suitable evacuation apparatus (not shown) and the tube is evacuated to a pressure of less than one micron. The quartz tube is then filled with hydrogen to a pressure of 10 millimeters, and the open end of the tube is sealed off as indicated at 10*d* in Fig. 1. The closed tube 10 is then removed from the evacuation apparatus and arranged in the same vertical position as indicated in Fig. 1 in a laboratory tube furnace. Various inert atmospheres over a range of pressures below atmospheric may be utilized in the quartz tube instead of the hydrogen atmosphere described above, if desired, and equivalent results obtained.

The laboratory tube furnace has a controlled temperature gradient from the top to the bottom thereof and with the tube 10 arranged in the furnace as indicated in Fig. 1, this gradient is such that the temperature of the substrate 11 is lower than that of the source germanium 12. The temperature gradient of the furnace is such that with the spacing X between the substrate 11 and the source germanium 12 being approximately 3″ for the particular tube 10 shown, the temperature of the substrate 11 is usually about 50 degrees centigrade lower than the temperature of the source germanium 12. The temperature of the source has been varied from 450 to 800° C. (the substrate usually being about 50° C. cooler) with satisfactory results being obtained. In most instances the process has been carried out with the source held at about 450° C. and with the substrate being accordingly maintained at about 400° C. The position of the tellurium 13 in the tube 10 is immaterial since at the temperatures being utilized, the tellurium is vaporized everywhere in the tube. It will be noted that if desired, the pyrolytic decomposition may be effected below 500° C. which is the temperature at which N type germanium and germanium having long whole lifetimes are stable.

It should be particularly pointed out that the above described spacing of 3 inches between the substrate germanium 11 and the source germanium 12 which gives a temperature differential of approximately 50 degrees centigrade therebetween in the particular tube furnace utilized, is only representative. It has been found, for example, that the vapor deposition will take place with a spacing of only ⅛ inch between the substrate and source germanium. With such a small spacing, the temperature differential between the source and substrate, is only 1 or 2 degrees centigrade.

The hydrogen atmosphere of the tube serves to reduce the germanium oxide layer of both the germanium source 12 and substrate 11. The vaporized tellurium serves the dual role of germanium transport mechanism and doping agent. A volatile germanium telluride is formed on the surface of the source germanium 12 under the above described temperature conditions. This volatile compound then dissociates by condensation on the surface of the substrate germanium 11 and deposits a layer of germanium thereon. Most of the tellurium from the dissociated compound is then free to return to the tube atmosphere to repeat the process of germanium transport, but enough is retained in the deposited layer to render N type conductivity. The thickness of the deposited layer varies proportionally with the time the tube remains in the furnace under a given set of temperature conditions. The germanium deposition on the substrate is epitaxial and is of uniform character. If desired, selenium or sulphur may be utilized in place of tellurium as the germanium transport medium and impurity element. The elements tellurium, selenium and sulphur are all elements of main group VI of the periodic table. It should be particularly noted in the above described process that the germanium is transported from the source to the substrate in a volatile compound made of germanium and the impurity element tellurium (or selenium or sulphur).

Figure 2:
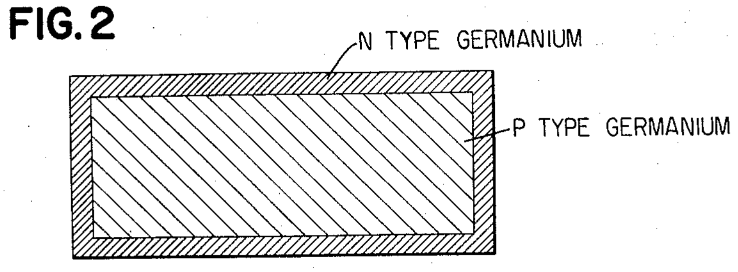
Fig. 2 is a side view, in section, of a germanium body comprised of a wafer of P type germanium with a layer of N type germanium deposited therein in accordance with the improved method.

After a time sufficient for the desired thickness of N type germanium to be deposited on the P type germanium wafer 11, the quartz tube is removed from the furnace and allowed to cool. After cooling, the tube 10 is opened and the wafer 11 removed. The wafer 11 will then appear as indicated in Fig. 2 with the original substrate of P type germanium and the N type film, the two forming the PN junction K. By reason of irregularities in the flat surface **10*a* of the tube, the vapor deposition is also effected on the undersurface of the substrate 11 as indicated in Fig. 2. The deposited film is of a single crystal structure with the same crystallographic orientation (epitaxial) as the wafer 11** and is substantially strain free. This junction has rectification properties and diodes fabricated from PN junctions made in the manner described above show the characteristic of an abrupt junction diode.

The invention may be utilized to produce successive layers of different conductivities or opposite conductivity type. For example, after the depositing of the coating of N type conductivity germanium, a coating of P type conductivity germanium may be deposited on the N type film or on a portion thereof by techniques well known in the art.

While there have been shown and described and pointed out the fundamental novel features of the invention as applied to a preferred embodiment, it will be understood that various omissions and substitutions and changes in the form and details of the process illustrated may be made by those skilled in the art without departing from the spirit of the invention. It is the intention therefore to be limited only as indicated by the scope of the following claims.

What is claimed is:

1. The method of forming upon a P conductivity type germanium body, a film of N conductivity type germanium which comprises, mounting said body in a closed container, maintaining an inert atmosphere in said container, producing in said atmosphere a volatile compound formed of substantially intrinsic germanium, and any one of the elements of the group consisting of tellurium, selenium or sulfur, and maintaining said germanium body in said container at a temperature to decompose thereupon by condensation said volatile compound in the atmosphere adjacent thereto, the decomposition depositing as an epitaxial film the germanium portion of said decomposed compound, said deposited germanium retaining therein a portion of the element of said group, the remainder of the said element of the decomposed compound returning to said atmosphere.

2. The method of depositing a layer of N conductivity type germanium upon a body of germanium which comprises maintaining said body in an atmosphere of hydrogen and a volatile compound formed of intrinsic or near intrinsic germanium and tellurium, and maintaining said body in said atmosphere at a temperature to decompose thereupon by condensation the volatile compound in the atmosphere adjacent thereto, the decomposition depositing as an epitaxial film the germanium portion of said decomposed compound, said deposited germanium retaining therein a portion of the tellurium of said compound, the remainder of the tellurium of the decomposed compound returning to said atmosphere.

3. The method of depositing a layer of N conductivity type germanium upon a body of P conductivity type germanium which comprises establishing a hydrogen atmosphere about said body, introducing into said hydrogen atmosphere a vapor of germanium telluride, and maintaining said germanium body at a temperature of at least 400° C. to cause said vapor to dissociate thereupon by condensation.

4. The method of depositing a layer of N conductivity type germanium upon a body of germanium which comprises maintaining an atmosphere of germanium telluride adjacent said body, and maintaining said body at a temperature to decompose said germanium telluride upon said body by condensation, the decomposition depositing the germanium portion of the decomposed compound with the deposited germanium retaining some of the tellurium of the decomposed compound, with the remainder of the tellurium of the decomposed compound returning to said atmosphere.

5. The method of forming a layer of N conductivity type germanium upon a body of P conductivity type germanium which comprises the steps of placing said germanium body in a closable container, placing a quantity of intrinsic or near intrinsic germanium in said container and spaced from said body of P conductivity type germanium, placing a quantity of tellurium in said container, sealing said container from the atmosphere, introducing an atmosphere of hydrogen into said container, and then applying a temperature gradient to said container so that said germanium body is maintained at a temperature of at least 400° C. while said germanium material is maintained at a higher temperature than said germanium body, said temperature gradient being maintained until a layer of desired thickness is formed.

6. The method of forming a layer of N conductivity type germanium upon a body of P conductivity type germanium which comprises the steps of mounting said germanium body and a quantity of intrinsic or near intrinsic germanium in a spaced relationship within a closable container, placing a quantity of any one of the elements of the group consisting of tellurium, selenium, and sulfur in said container, establishing an inert atmosphere at a pressure below atmospheric within said container, and applying a temperature gradient to said container so that germanium body is maintained at a temperature below the temperature of said quantity of germanium material, said gradient being such that the element of said group is vaporized any place within said container, said gradient being maintained until a layer of desired thickness is formed.

7. The method of claim 6 wherein the said temperature gradient is such that said germanium body temperature is at least 400° C.

8. The method of fabricating a PN junction by depositing a layer of N conductivity type germanium upon a germanium body of P conductivity type, which comprises placing a quantity of any one of the elements of a group consisting of tellurium, selenium, and sulfur, a mass of intrinsic or near intrinsic germanium, and said germanium body in an enclosable container, said germanium mass being spaced from said germanium body, closing said container to the external atmosphere, producing a hydrogen atmosphere in said container, and heating said container in a temperature gradient so that said mass is maintained at a temperature above the temperature of said germanium body while said germanium body is maintained at a temperature of 400° C. or above.

9. The method of fabricating a PN junction by vapor deposition of a layer of N conductivity type germanium upon a germanium body of P conductivity type, which comprises placing a quantity of any one of the elements of a group consisting of tellurium, selenium or sulfur, a mass of intrinsic or near intrinsic germanium, and said germanium body in a sealable container, said germanium mass being spaced from said germanium body, thereafter sealing said container from the external atmosphere, evacuating said container to a pressure of less than 1 micron, filling said container with hydrogen to a pressure in the range of 10 millimeters, and heating said container in a temperature gradient for a variable time dependent upon the thickness of the layer to be deposited, said gradient being such that said germanium mass is maintained at a temperature anywhere in the range from 450° centigrade to the melting point of germanium while said germanium body is always maintained at a temperature lower than said germanium mass temperature.

10. The method of fabricating a PN junction by vapor deposition of a layer of N conductivity type germanium upon a germanium body of P conductivity type, which comprises placing said body, a source body of intrinsic or near intrinsic germanium and a quantity of tellurium, in a chemically inert container, said container being adapted to be sealed from the atmosphere, said source and body being spaced from each other, sealing said container from the atmosphere, evacuating said container to a pressure of less than one micron, filling said container with hydrogen to a pressure in the range of 10 millimeters and heating said container in a temperature gradient for a variable time dependent upon the thickness of the layer to be deposited said gradient being such that said source is at a temperature in the range from 450° centigrade to 800 degrees centigrade, while said germanium body is maintained at a temperature lower than said source germanium temperature.

11. The method of depositing a layer of N conductivity type germanium upon a body of germanium which comprises maintaining said body in an atmosphere of a chemically inert gas and a volatile compound formed of intrinsic or near intrinsic germanium and selenium, and maintaining said body in said atmosphere at a temperature to decompose thereupon by condensation the volatile compound in the atmosphere adjacent thereto, the decomposition depositing as an epitaxial film the germanium portion of said decomposed compound, said deposited germanium retaining thereon a portion of the selenium of said compound.

12. The method of depositing a layer of N conductivity type germanium upon a body of germanium which comprises maintaining said body in an atmosphere of a chemically inert gas and a volatile compound formed of intrinsic or near intrinsic germanium and sulfur, and maintaining said body in said atmosphere at a temperature to decompose thereupon by condensation the volatile compound in the atmosphere adjacent thereto, the decomposition depositing as an epitaxial film the germanium portion of said decomposed compound, said deposited germanium retaining therein a portion of the sulfur of said compound.

References Cited in the file of this patent

UNITED STATES PATENTS

| | | |
|---|---|---|
| 1,601,931 | Van Arkel | Oct. 5, 1926 |
| 2,763,581 | Freedman | Sept. 18, 1956 |

FOREIGN PATENTS

| | | |
|---|---|---|
| 200,917 | Australia | Feb. 16, 1956 |